(12) United States Patent
Tsui et al.

(10) Patent No.: US 9,117,715 B2
(45) Date of Patent: Aug. 25, 2015

(54) WAFER-LEVEL DEVICE PACKAGING

(75) Inventors: Yat Kit Tsui, Hong Kong (HK); Dan Yang, Hong Kong (HK); Pui Chung Law, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 351 days.

(21) Appl. No.: 13/551,610

(22) Filed: Jul. 18, 2012

(65) Prior Publication Data

US 2014/0021596 A1    Jan. 23, 2014

(51) Int. Cl.
| | | |
|---|---|---|
| *H01L 23/02* | (2006.01) | |
| *H01L 23/48* | (2006.01) | |
| *H01L 23/52* | (2006.01) | |
| *H01L 29/40* | (2006.01) | |
| *H01L 21/00* | (2006.01) | |
| *H01L 27/146* | (2006.01) | |
| *H01L 25/065* | (2006.01) | |
| *H01L 25/00* | (2006.01) | |
| *H01L 23/31* | (2006.01) | |
| *H01L 23/00* | (2006.01) | |

(52) U.S. Cl.
CPC .......... *H01L 27/14618* (2013.01); *H01L 24/05* (2013.01); *H01L 24/11* (2013.01); *H01L 24/13* (2013.01); *H01L 24/16* (2013.01); *H01L 24/19* (2013.01); *H01L 24/20* (2013.01); *H01L 24/92* (2013.01); *H01L 24/97* (2013.01); *H01L 25/0657* (2013.01); *H01L 25/50* (2013.01); *H01L 27/14632* (2013.01); *H01L 27/14687* (2013.01); *H01L 23/3114* (2013.01); *H01L 24/03* (2013.01); *H01L 24/17* (2013.01); *H01L 24/32* (2013.01); *H01L 24/81* (2013.01); *H01L 24/94* (2013.01); *H01L 2224/03464* (2013.01); *H01L 2224/0401* (2013.01); *H01L 2224/04105* (2013.01); *H01L 2224/05155* (2013.01); *H01L 2224/05644* (2013.01); *H01L 2224/10156* (2013.01); *H01L 2224/1132* (2013.01); *H01L 2224/1182* (2013.01); *H01L 2224/1183* (2013.01); *H01L 2224/11849* (2013.01); *H01L 2224/12105* (2013.01); *H01L 2224/131* (2013.01); *H01L 2224/1319* (2013.01); *H01L 2224/1369* (2013.01); *H01L 2224/13147* (2013.01); *H01L 2224/13565* (2013.01); *H01L 2224/16106* (2013.01); *H01L 2224/16148* (2013.01); *H01L 2224/16157* (2013.01); *H01L 2224/16168* (2013.01); *H01L 2224/16227* (2013.01); *H01L 2224/16238* (2013.01); *H01L 2224/17181* (2013.01); *H01L 2224/211* (2013.01); *H01L 2224/2101* (2013.01); *H01L 2224/214* (2013.01); *H01L 2224/215* (2013.01); *H01L 2224/32225* (2013.01); *H01L 2224/73203* (2013.01); *H01L 2224/8185* (2013.01); *H01L 2224/81191* (2013.01); *H01L 2224/81192* (2013.01); *H01L 2224/81193* (2013.01); *H01L 2224/81447* (2013.01); *H01L 2224/81801* (2013.01); *H01L 2224/81895* (2013.01); *H01L 2224/9202* (2013.01); *H01L 2224/92222* (2013.01); *H01L 2224/92224* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06555* (2013.01); *H01L 2225/06589* (2013.01); *H01L 2924/10156* (2013.01)

(58) Field of Classification Search
CPC ................... H01L 2924/0002; H01L 2924/00; H01L 2225/06513; H01L 2225/06517; H01L 2225/06541; H01L 2225/06555; H01L 2225/06589; H01L 23/3114; H01L 24/10; H01L 25/0657; H01L 25/50; H01L 21/4821; H01L 21/4839; H01L 2224/33517; H01L 2224/80136; H01L 2224/81136; H01L 2224/211; H01L 2924/00014; H01L 2924/00012; H01L 2924/014; H01L 2924/0665; H01L 2924/10156; H01L 2224/92222; H01L 2224/11; H01L 2224/19;

H01L 2224/81; H01L 2224/97; H01L 2224/03; H01L 2224/9202; H01L 2224/03464; H01L 2224/05155; H01L 2224/05644; H01L 2224/1132; H01L 2224/1182; H01L 2224/1183; H01L 2224/11849; H01L 2224/131; H01L 2224/13147; H01L 2224/1319; H01L 2224/73203; H01L 2224/81447; H01L 2224/81895; H01L 2224/94; H01L 2224/0401; H01L 2224/04105; H01L 2224/10156; H01L 2224/13565; H01L 2224/1369; H01L 2224/16106; H01L 2224/16148; H01L 2224/16157; H01L 2224/16168; H01L 2224/16227; H01L 2224/16238; H01L 2224/17181; H01L 2224/2101; H01L 2224/215; H01L 2224/32225; H01L 2224/81191; H01L 2224/81192; H01L 2224/81193; H01L 2224/81801; H01L 2224/8185; H01L 2224/92224; H01L 2224/214; H01L 2224/12105; H01L 21/78; H01L 24/03; H01L 24/05; H01L 24/11; H01L 24/13; H01L 24/16; H01L 24/17; H01L 24/19; H01L 24/20; H01L 24/32; H01L 24/81; H01L 24/92; H01L 24/94; H01L 24/97; H01L 27/14618; H01L 27/14632; H01L 27/14687

USPC .................................... 257/686, 777

See application file for complete search history.

(56) References Cited

U.S. PATENT DOCUMENTS

| | | | | |
|---|---|---|---|---|
| 3,761,782 | A * | 9/1973 | Youmans | 257/778 |
| 5,229,647 | A * | 7/1993 | Gnadinger | 257/785 |
| 6,221,751 | B1 * | 4/2001 | Chen et al. | 438/612 |
| 6,235,554 | B1 * | 5/2001 | Akram et al. | 438/109 |
| 6,312,974 | B1 | 11/2001 | Wu et al. | |
| 6,841,883 | B1 * | 1/2005 | Farnworth et al. | 257/777 |
| 6,884,650 | B2 | 4/2005 | Lee et al. | |
| 7,394,152 | B2 | 7/2008 | Yu et al. | |
| 7,989,356 | B2 | 8/2011 | Bao et al. | |
| 2004/0235270 | A1 * | 11/2004 | Noma et al. | 438/460 |
| 2006/0091488 | A1 | 5/2006 | Kang | |
| 2007/0069394 | A1 * | 3/2007 | Bachman et al. | 257/780 |
| 2007/0132104 | A1 * | 6/2007 | Farnworth et al. | 257/774 |
| 2007/0216028 | A1 * | 9/2007 | Lee et al. | 257/738 |
| 2007/0264757 | A1 * | 11/2007 | Kwon et al. | 438/127 |
| 2008/0157340 | A1 * | 7/2008 | Yang et al. | 257/691 |
| 2008/0224306 | A1 * | 9/2008 | Yang | 257/725 |
| 2009/0224402 | A1 * | 9/2009 | Do et al. | 257/738 |
| 2009/0243083 | A1 * | 10/2009 | Han et al. | 257/698 |
| 2009/0283903 | A1 * | 11/2009 | Park | 257/737 |
| 2010/0013102 | A1 * | 1/2010 | Tay et al. | 257/774 |
| 2011/0018117 | A1 * | 1/2011 | Yang et al. | 257/690 |
| 2011/0215449 | A1 * | 9/2011 | Camacho et al. | 257/659 |
| 2012/0012997 | A1 * | 1/2012 | Shen et al. | 257/737 |
| 2012/0049334 | A1 * | 3/2012 | Pagaila et al. | 257/666 |
| 2014/0151900 | A1 * | 6/2014 | Hu et al. | 257/774 |
| 2014/0167253 | A1 * | 6/2014 | Tseng et al. | 257/737 |

FOREIGN PATENT DOCUMENTS

| | | |
|---|---|---|
| CN | 101304015 A | 11/2008 |
| CN | 101356645 A | 1/2009 |
| JP | 2002329852 A | 11/2002 |

OTHER PUBLICATIONS

Office Action issued from the State Intellectual Property Office of the People's Republic of China on Jul. 17, 2014.

* cited by examiner

*Primary Examiner* — Teresa M Arroyo

(74) *Attorney, Agent, or Firm* — Ella Cheong Hong Kong; Sam T. Yip

(57) ABSTRACT

The present invention relates to a semiconductor device packaged at the wafer level such that an entire packaged device is formed prior to separation of individual devices. The semiconductor device package includes a semiconductor chip having one or more bonding pads associated with the chip and a protective layer bonded over the semiconductor chip. An insulation layer is positioned on at least side edges and a lower surface of the semiconductor chip. Interconnection/bump metallization is positioned adjacent one or more side edges of the semiconductor chip and is electrically connected to at least one bonding pad. A compact image sensor package can be formed that is vertically integrated with a digital signal processor and memory chip along with lenses and a protective cover.

12 Claims, 18 Drawing Sheets

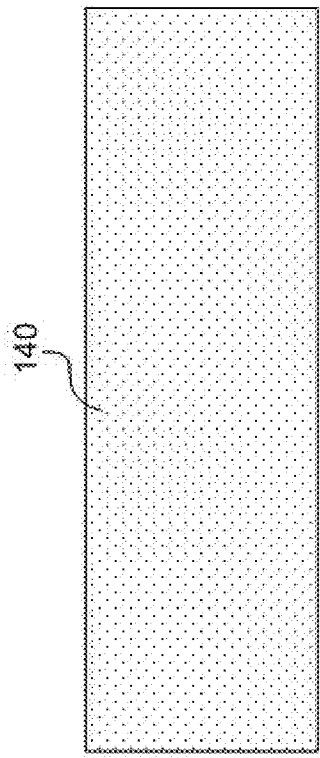
FIG. 2A    Glass Wafer
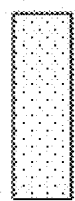

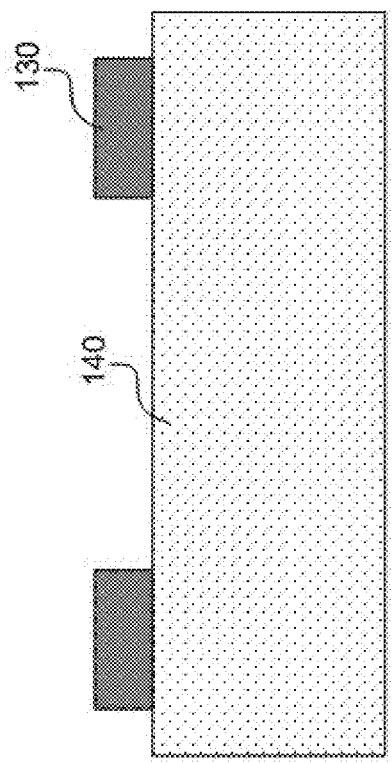
FIG. 2B  Metal Stud Forming

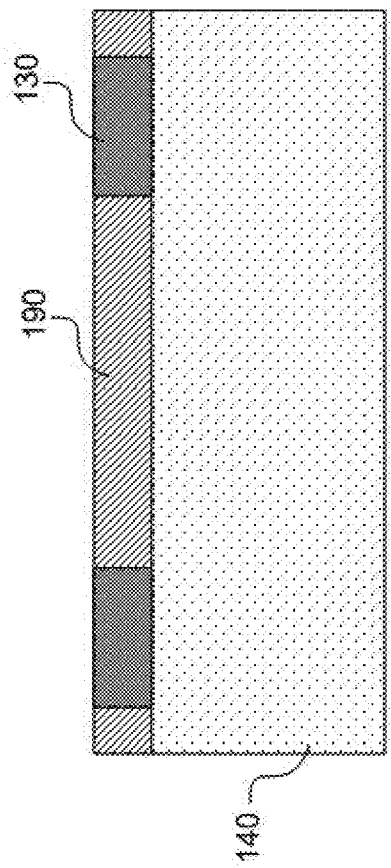
FIG. 2C  Polymer Coating

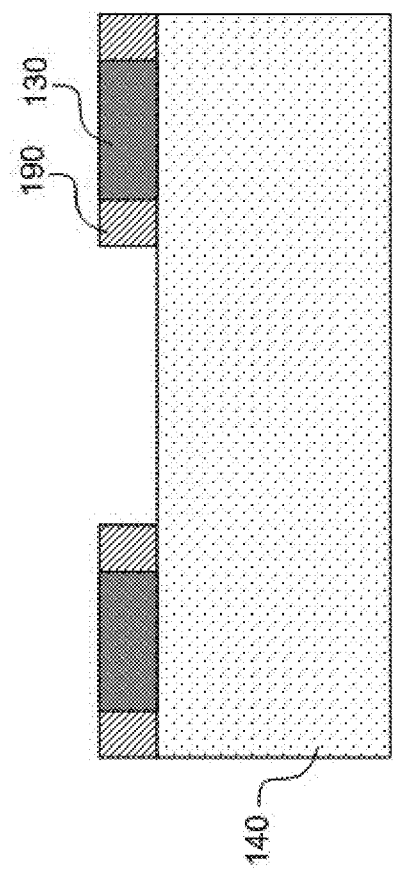
FIG. 2D  Polymer Patterning

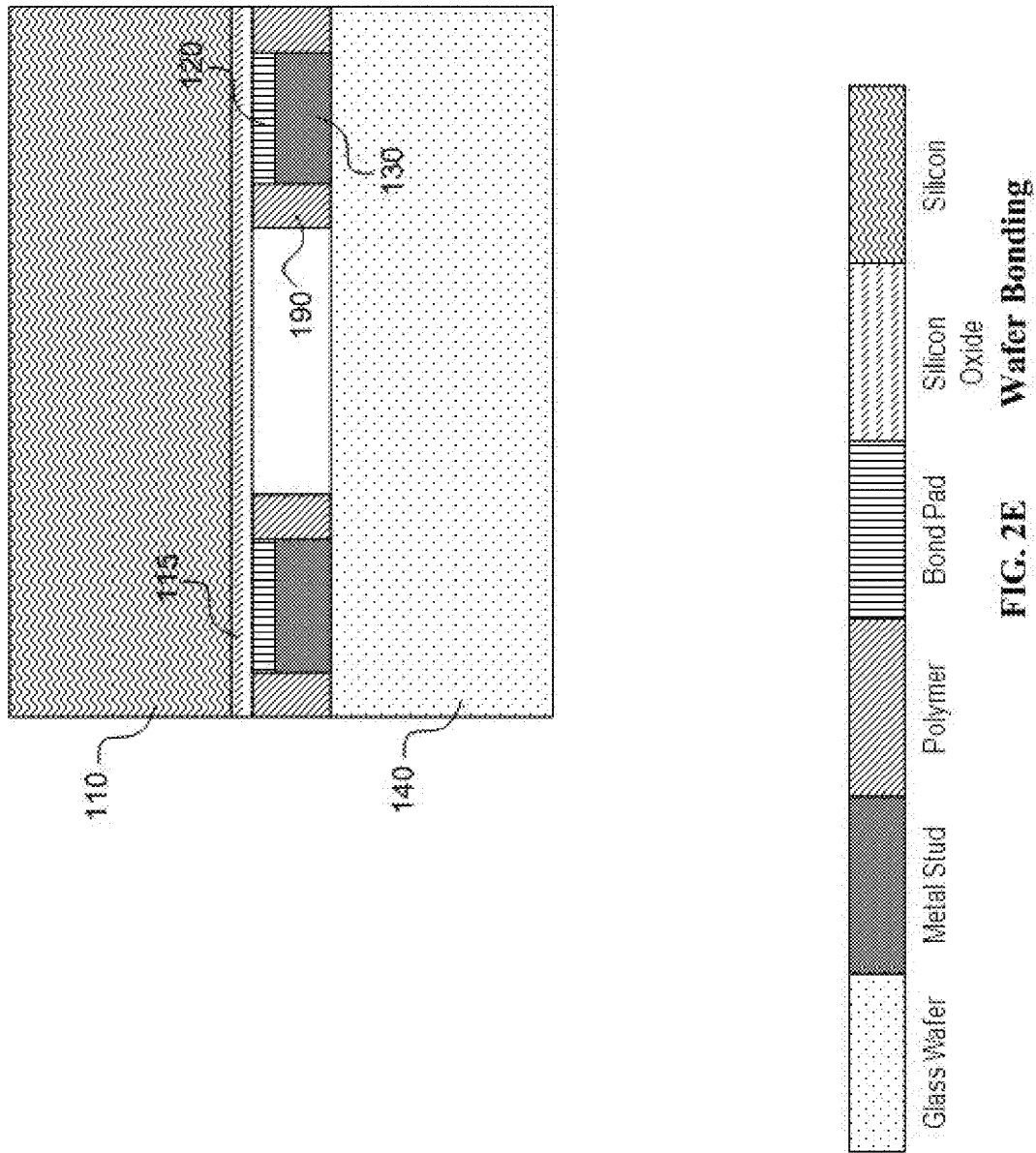

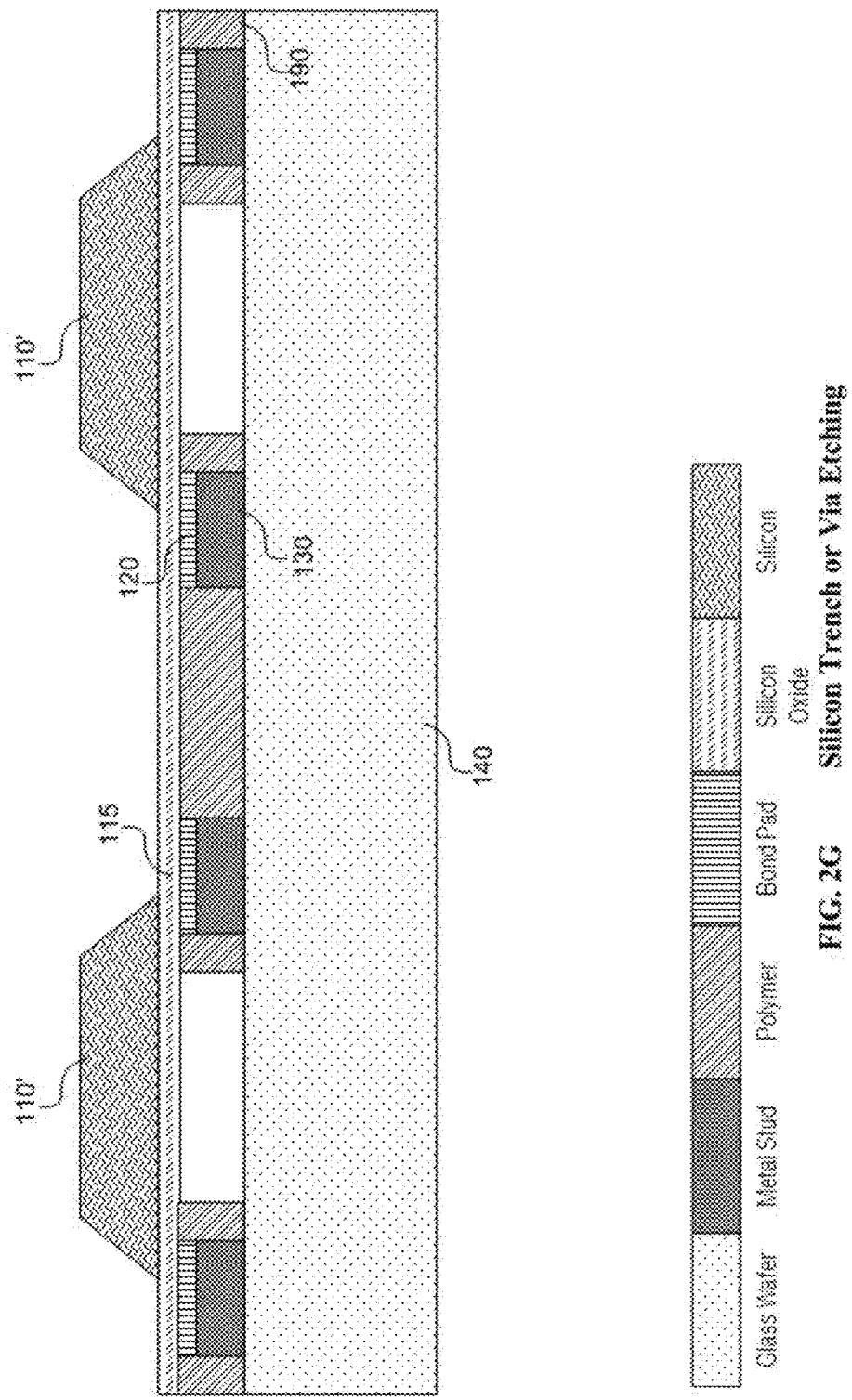
FIG. 2G  Silicon Trench or Via Etching

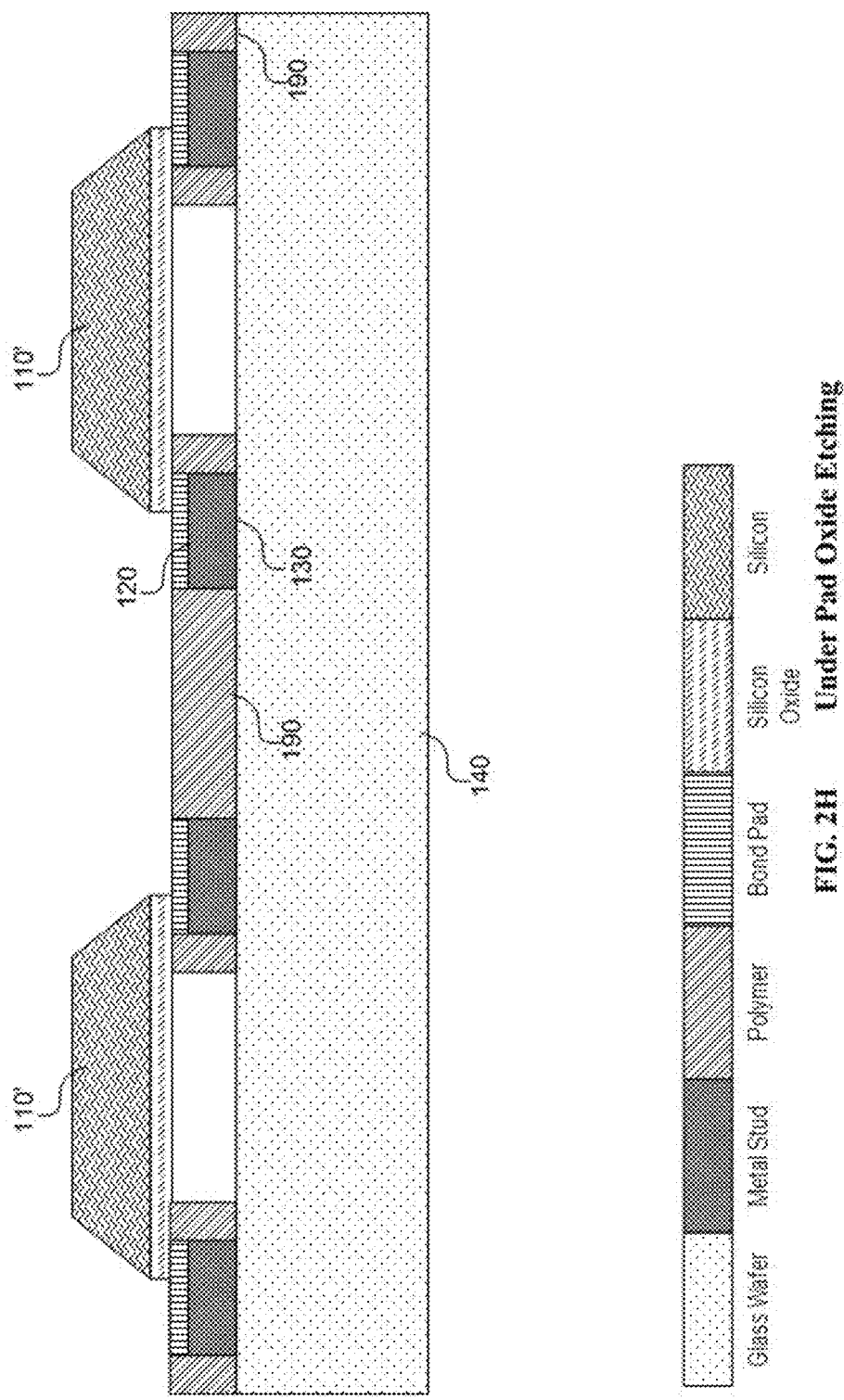

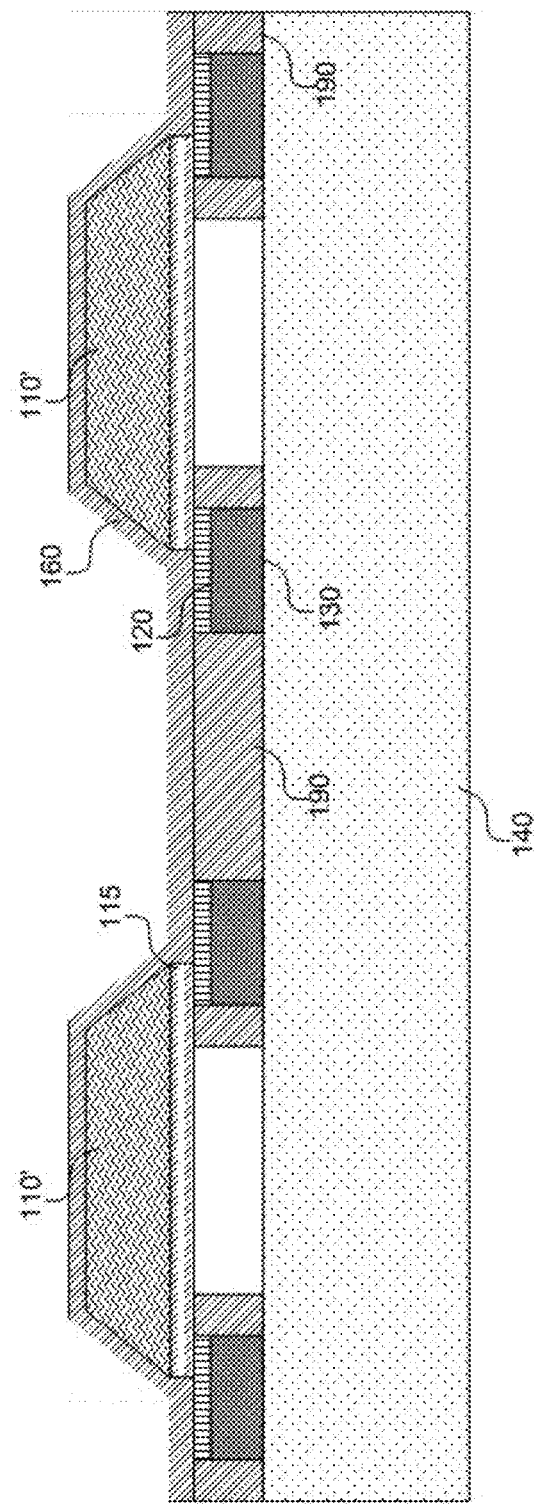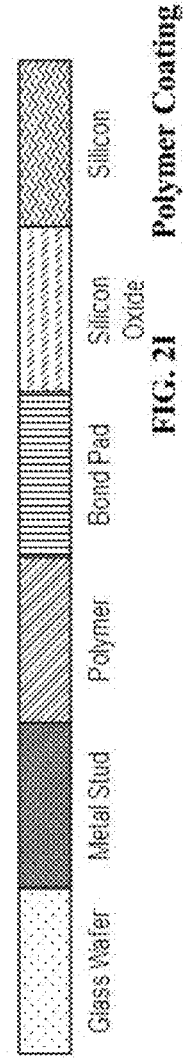
FIG. 21   Polymer Coating

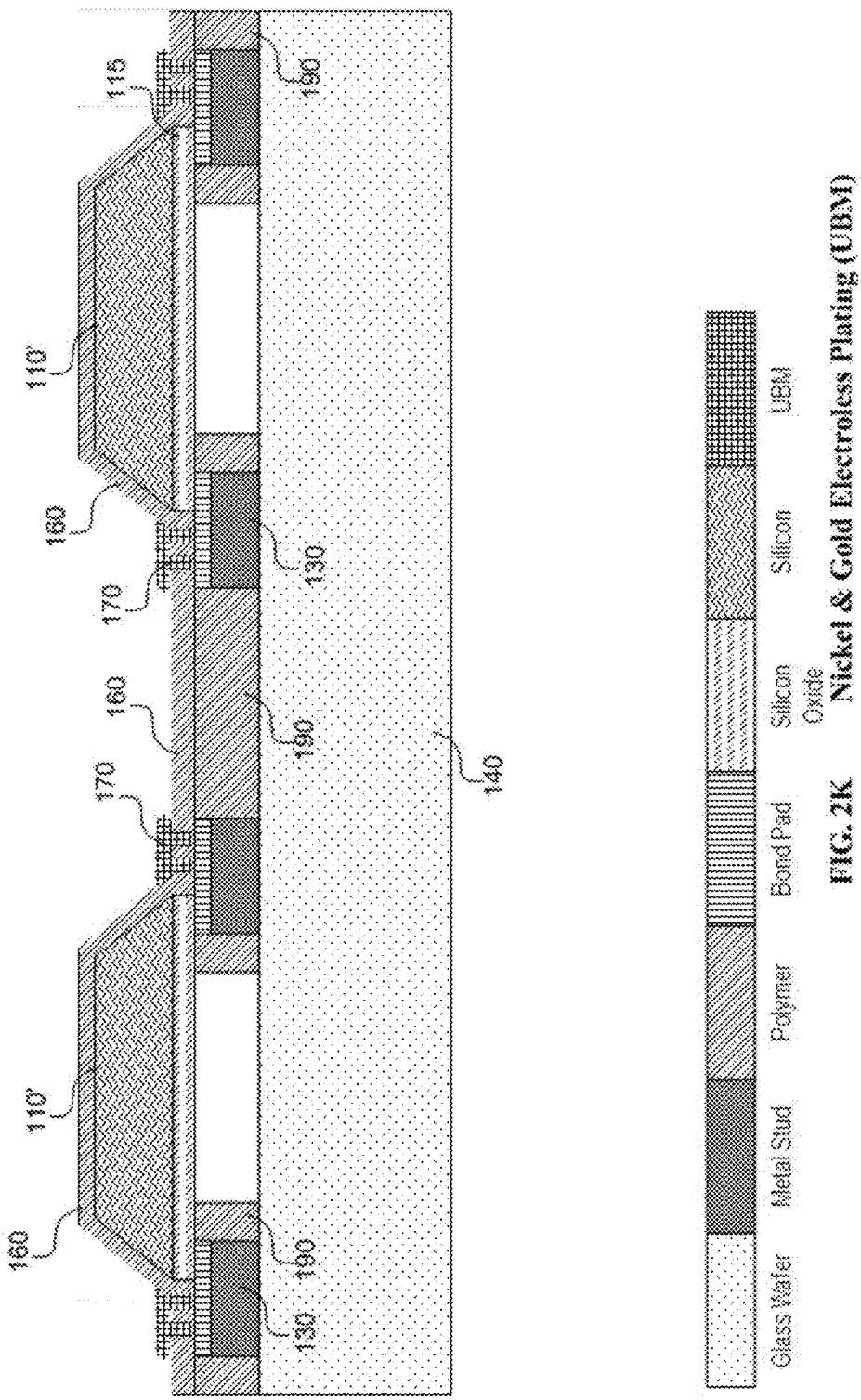

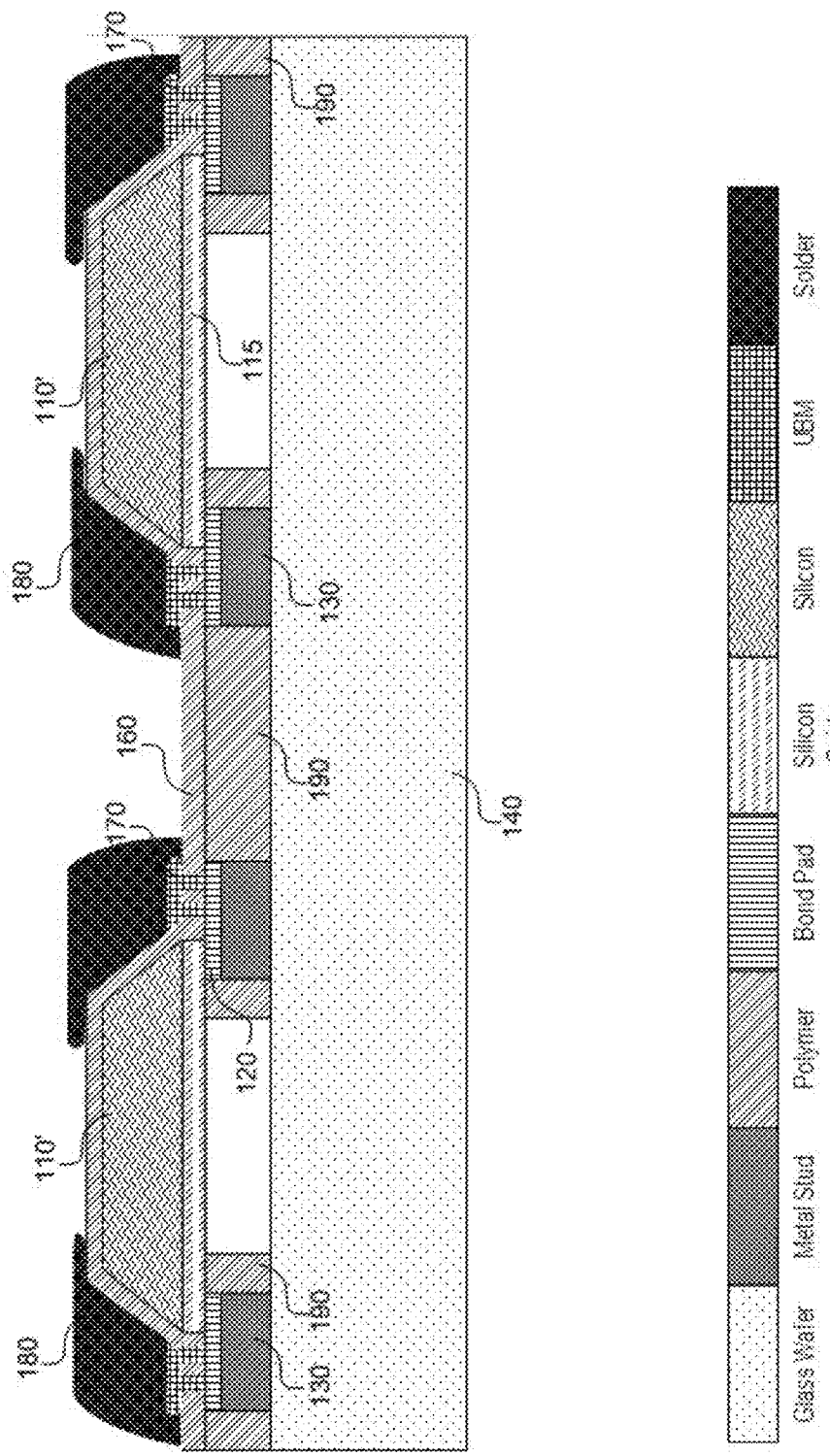

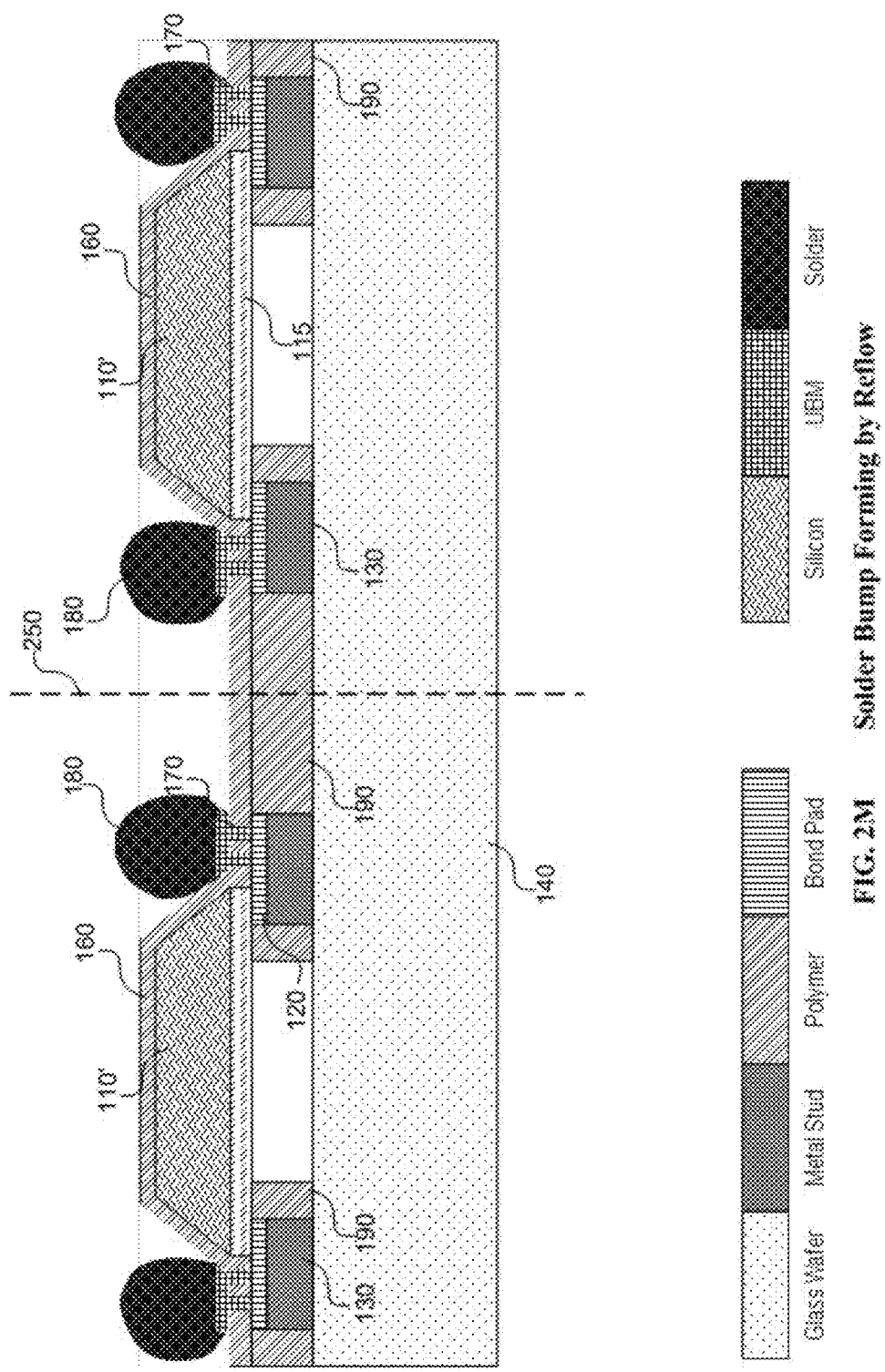

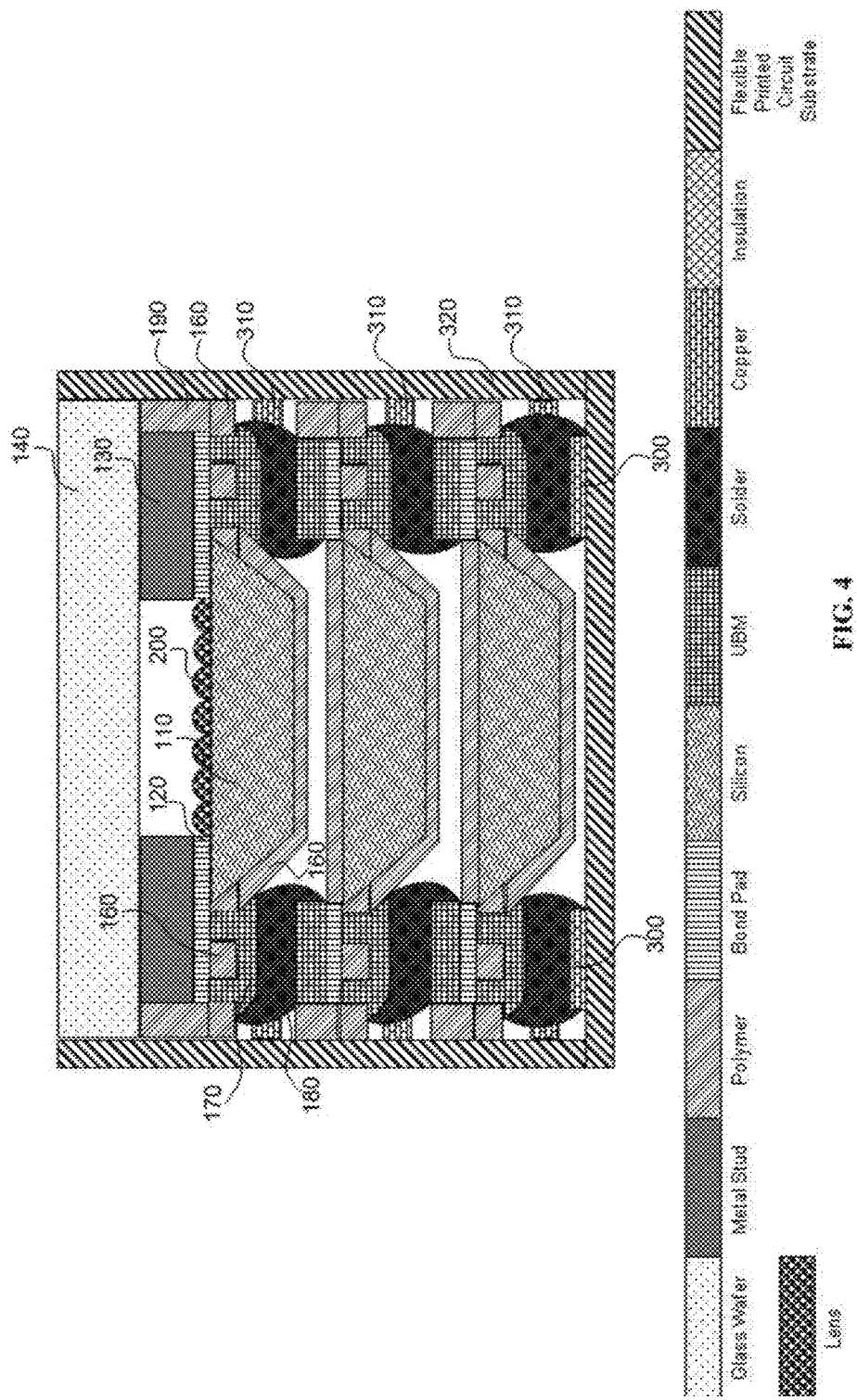

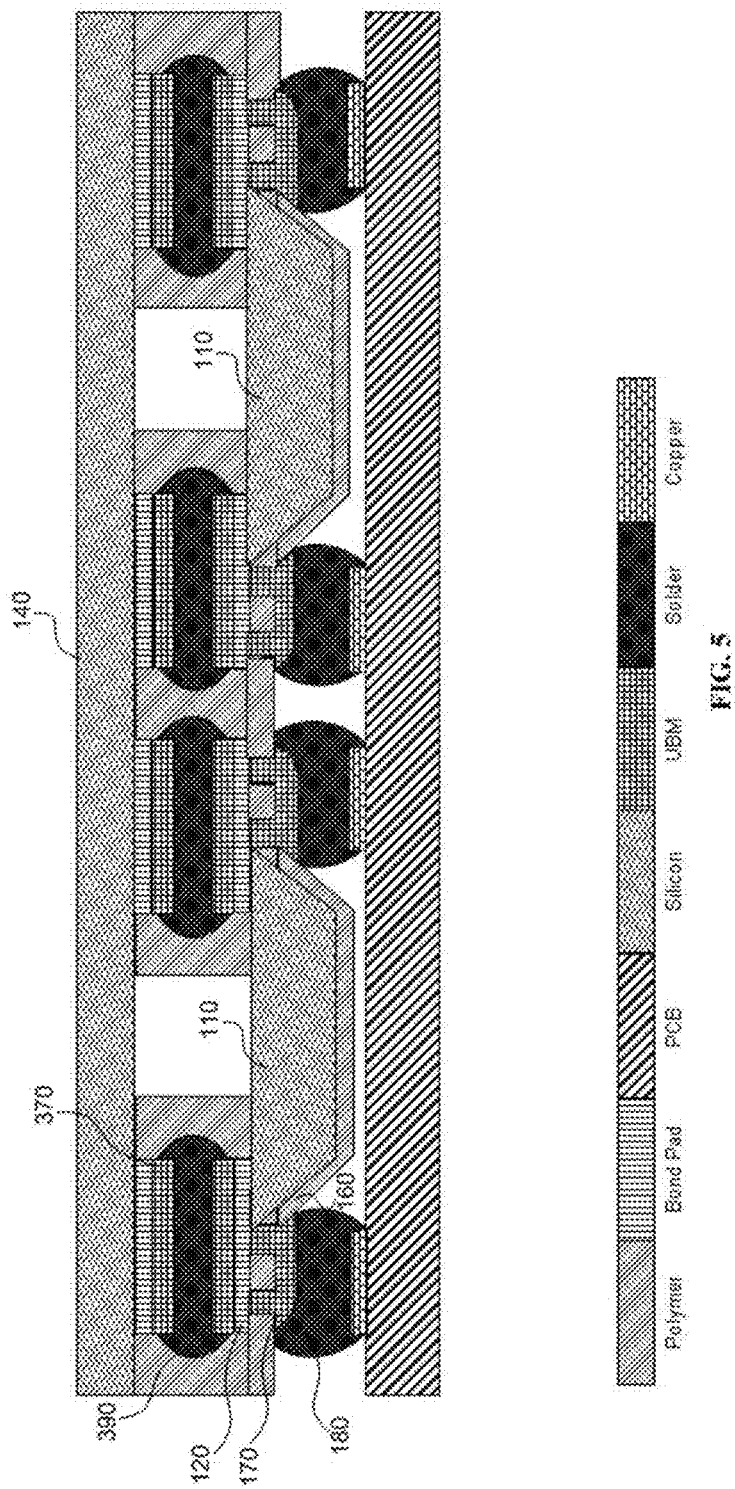

WAFER-LEVEL DEVICE PACKAGING

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to wafer-level device packaging and, more particularly, to wafer level device packaging in which device interconnection metallization is positioned adjacent to a functional device.

BACKGROUND

Packaging requirements for semiconductor devices have become more stringent as the competing demands of increased functionality and smaller electronic products continue to force device manufacturers to create ever more complex package designs. In particular, increased demands for compact devices have led package manufacturers to pursue vertical integration of multiple chips to decrease the overall package size, permitting smaller final electronic products.

For example "system-in-package" designs have been created for CMOS image sensors with associated digital signal processor and memory chips. In order to electrically interconnect the chips in these vertically integrated packages, various techniques have been adopted. Conventionally, through-silicon-vias (TSVs) have been formed through silicon chips and filled with conductors that connect to solder bumps positioned beneath each chip.

To eliminate the need for TSVs, the SHELLCASE® (Tessera) technique has been created. In the SHELLCASE technology, electrical leads are formed on the edge of each device chip to interconnect the bonding pad to solder bumps positioned beneath each chip.

Both the TSV and SHELLCASE approaches require expensive wafer processing to create the final multi-chip device package. Further, each solder bump and its associated metallization requires approximately 100 microns of height, placing a lower limit on the final package thickness. Further, the SHELLCASE approach requires a complex electrical path which can lead to decreased package reliability, particularly in view of the large differences in coefficients of thermal expansion between metallization layers and underlying semiconductor materials.

Thus there is a need in the art for improved packaging formed at the wafer level with easy-to-fabricate electrical connections that minimize package thickness and provide reliable interconnections.

SUMMARY OF THE INVENTION

The present invention relates to a semiconductor device packaged at the wafer level such that an entire packaged device is formed prior to separation of individual devices. In this manner, particulates generated during device separation do not interfere with device operation.

The semiconductor device package includes a semiconductor chip having one or more semiconductor devices formed therein. One or more bonding pads are associated with the semiconductor chip and a protective layer is bonded over the semiconductor chip at the one or more bonding pads or through an intermediate layer positioned over the bonding pads. An insulation layer is positioned on at least side edges and a lower surface of the semiconductor chip. In one embodiment, interconnection/bump metallization is positioned adjacent one or more side edges of the semiconductor chip and is electrically connected to at least one of the one or more bonding pads, which are electrical bonding pads.

In one embodiment, an image sensor package is formed which is vertically integrated with a digital signal processor and memory chip along with lenses and a protective cover. Low cost and reliable interconnects are formed and a thinner package profile is enabled by the present invention.

BRIEF DESCRIPTION OF THE DRAWINGS

FIGS. 2A-2M are enlarged portions of the corresponding aspects of FIG. 2.

FIG. 4 depicts a heat-dissipation package structure for the multilevel device of FIG. 1.

FIG. 5 depicts horizontal integration of semiconductor chips packaged according to the present invention.

DETAILED DESCRIPTION

Figure 1:
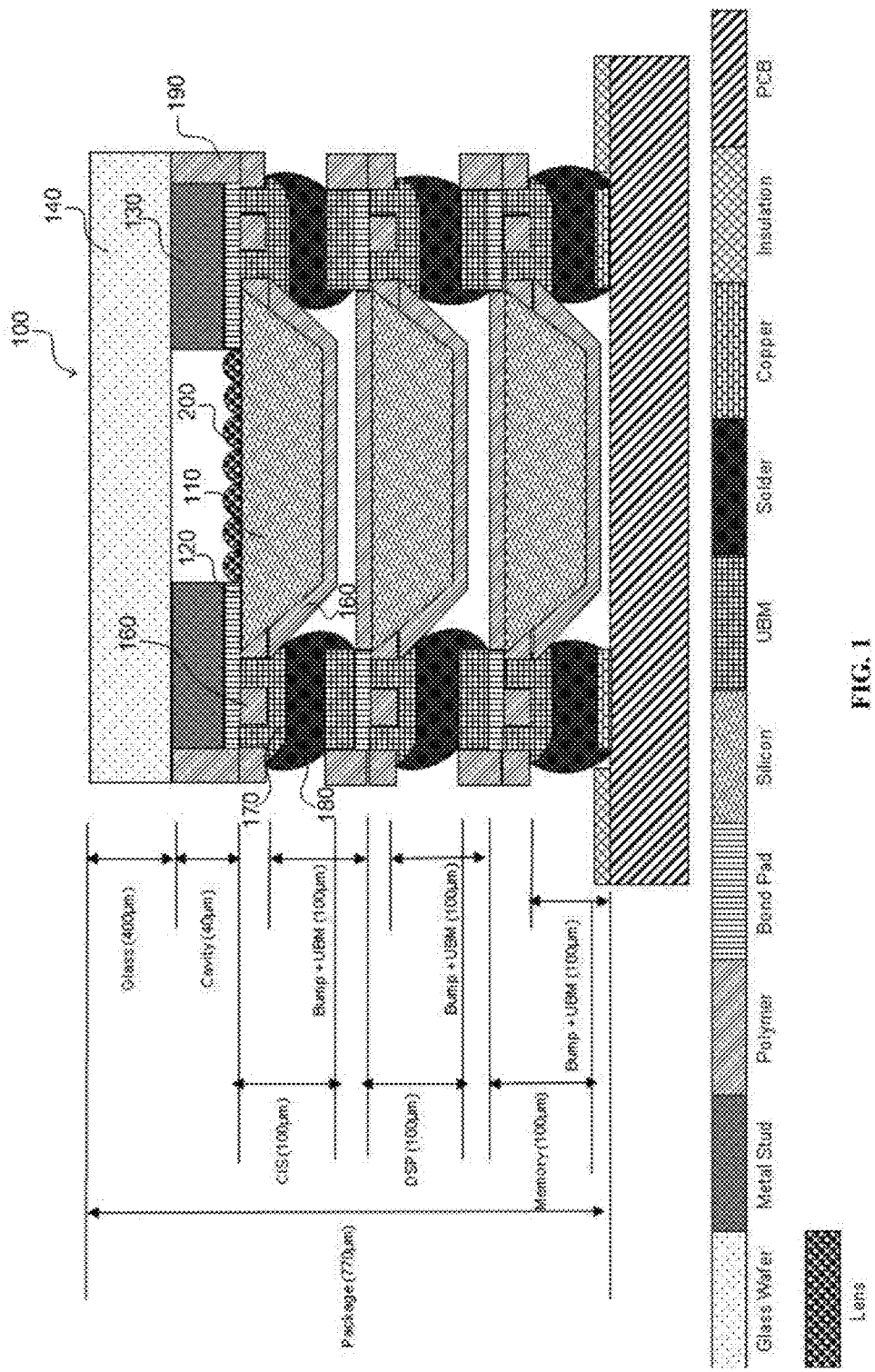
FIG. 1 is a multilevel device package according to one embodiment of the present invention.

Turning to the drawings in detail, FIG. 1 depicts a wafer-level device package according to one embodiment of the present invention. Advantageously, packaging of individual devices at the wafer level avoids device contamination by particulates generated during device separation (e.g., dicing). That is, a finished, encapsulated device is formed prior to division into discrete devices such that particulates cannot reach the individual semiconductor chips.

In the exemplary embodiment of FIG. 1, an image sensor "system on chip" 100 is depicted; however, the features described in connection with FIG. 1 are applicable to single layer (that is, not vertically-integrated) device packages as will be discussed below.

In FIG. 1, an imaging device such as CMOS image sensor 110 has bonding pads 120 positioned thereon. Optionally, metal studs 130 are positioned over the bonding pads 120 to provide additional heat sink capabilities and/or to increase the clearance over image sensor 110. The additional clearance from the metal studs permits formation of lens array 200 over the image sensor. A protective layer 140 is bonded to the image sensor 110 through the bonding pads 120/metal studs 130 structure. For the image sensor application, protective layer 140 is a transparent material such as glass, fused silica, or alumina. Transparent polymer layers can also be used. For non-imaging applications, layer 140 need not be transparent.

An insulation material 160 covers at least the side and bottom surfaces of imaging device 110. Optionally, the insulation material 160 also covers selected portions of the bonding pad 120. Under bump metallization 170 contacts bonding pad 120 to form an electrical connection therewith.

Electrical connection bump 180, such as a solder bump, is formed on the under bump metallization 170. The optional insulation material 160 on the bonding pad assists in formation of the under bump metallization (discussed below) and provides structural support. A separate insulation material 190 isolates the bonding pad 120 and the copper studs 130.

Figure 2:
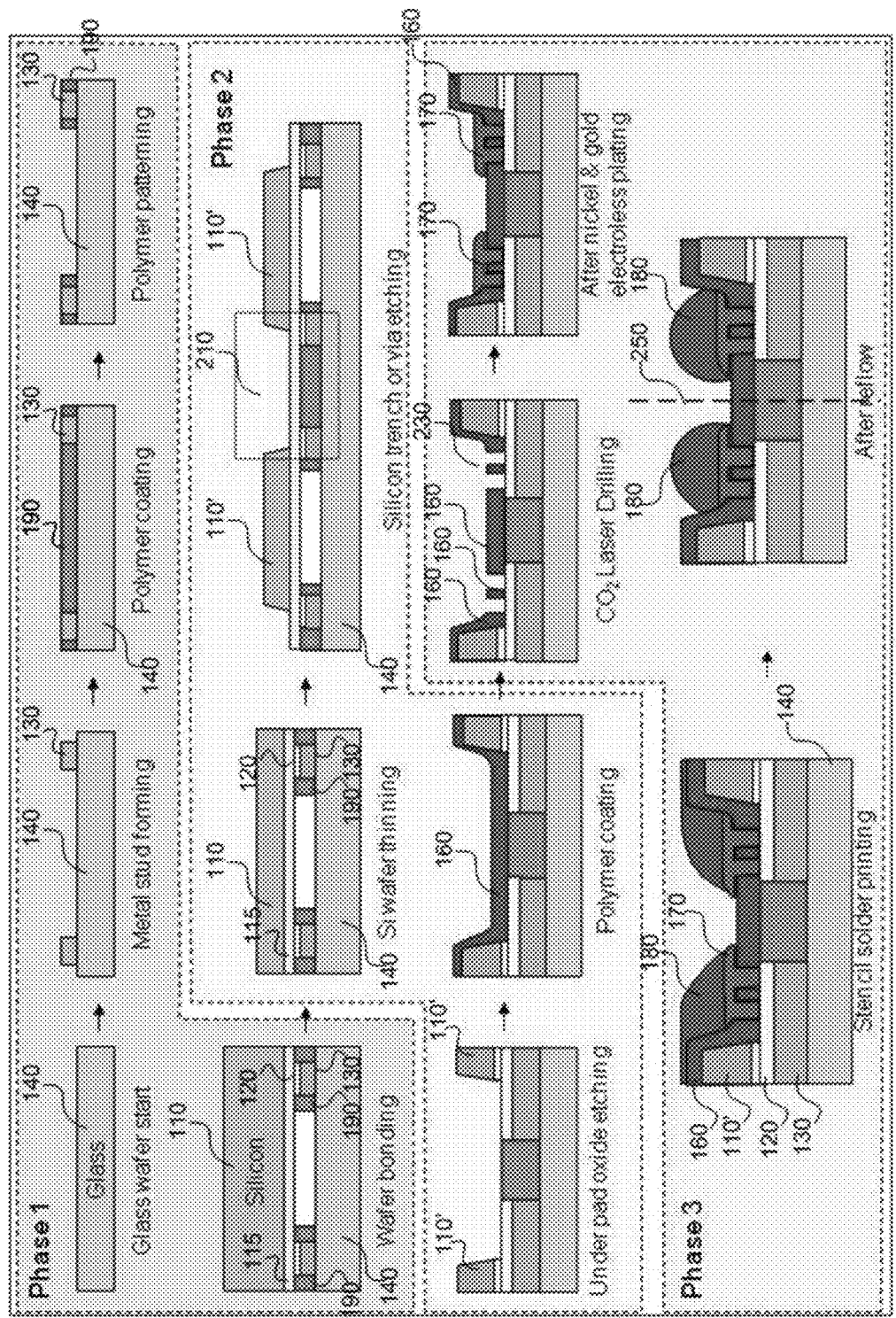
FIG. 2 is an overview of processing used to form the package of FIG. 1

FIG. 2 provides an overview of an exemplary fabrication process for the vertically-integrated device of FIG. 1. Each sub-figure, labeled 2A-2M is reproduced in larger format following FIG. 2 so that the various device structures can be more easily seen.

In FIG. 2A, a protective layer/protective substrate 140 is provided. As discussed above, for imaging sensor packages, the material of layer 140 is substantially transparent such as glass, silica, alumina, or a polymer. In FIG. 2B, optional metal studs 130 are deposited on layer 140, followed by deposition of polymer coating 190. Polymer coating 190 is patterned in FIG. 2D to substantially surround metal studs 130 and provide electrical isolation therefor.

A silicon wafer 110 is bonded to the structure of FIG. 2D in the process of 2E. Silicon wafer includes a plurality of semiconductor devices formed therein; note that device formation can take place before the bonding to layer 140. Although device formation typically occurs before bonding to layer 140, it is possible to fabricate devices in the semiconductor/silicon wafer after bonding. Silicon wafer 110 includes oxide layer 115 and bonding pads 120 and is bonded directly or through an intermediate adhesive layer to the structure of FIG. 2D. Exemplary adhesives include solder-based adhesives and conductive epoxy-based adhesives.

Figure 2F:
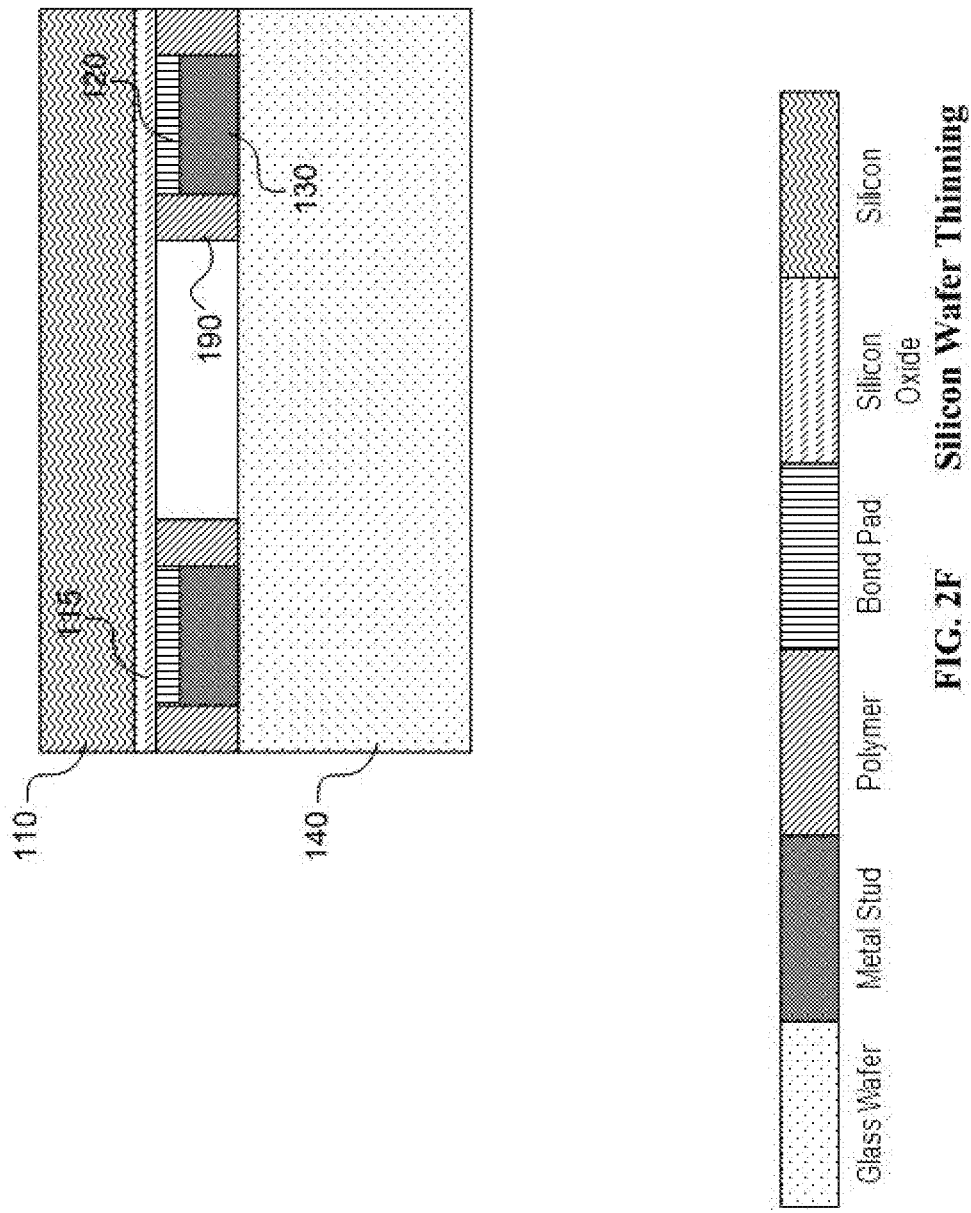

The silicon wafer is thinned in FIG. 2F, typically by chemical-mechanical polishing although any chemical, mechanical, or combined removal technique may be used. Note that devices may be formed in the silicon wafer following wafer thinning.

To provide separation between individual semiconductor devices, trenches 210 are etched between adjacent devices 110' in FIG. 2G. Anisotropic etching can be used to form trenches 210 (e.g., wet etching) or isotropic etching can be used.

Following trench formation, the oxide layer 115 in the trench region is removed in 2H. Depending upon the trench formation in 2G, the oxide layer 115 may be removed when the trench is created. In order to isolate individual devices 110', a polymer layer 160 is deposited, covering the sides and the bottom of what will eventually be individual semiconductor chips. Optionally, the polymer layer 160 covers portions of the bonding pads 120 that are not covered by the individual devices 110' as seen in FIG. 2I. To expose portions of bonding pads 120, openings 230 are created in polymer layer 160 in 2J. An exemplary technique for forming openings 230 is by laser drilling with a $CO_2$ laser; however, other etching or ablation techniques can be used to form the openings.

Figure 2J:
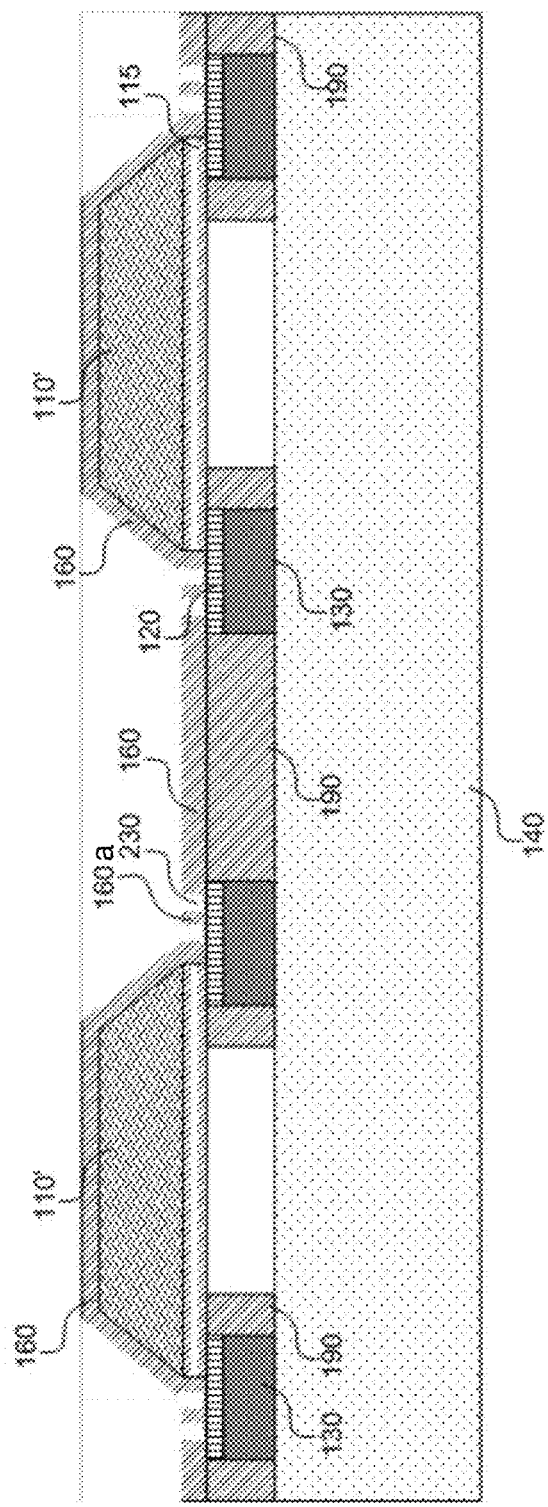
Figure 2J:
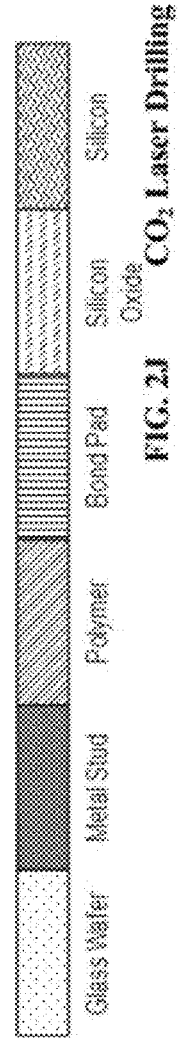

In FIG. 2K, under bump metallization layer 170 is formed. When a patterned polymer layer is used as shown in FIG. 2J, electroless plating techniques can be used to form the under bump metallization 170 with the remaining polymer walls 160a providing mechanical reinforcement for the layer. Nickel and gold electroless plating can be used to form under bump metallization 170 in FIG. 2K; these materials provide a solder-wettable surface for subsequent solder bump formation.

Solder 180 is deposited over the under bump metallization in FIG. 2L followed by reflow in FIG. 2M to form solder balls 180. Advantageously, the solder bump allows a greater alignment tolerance while at the same time maintaining the gap between vertically-stacked device chips.

Figure 3:
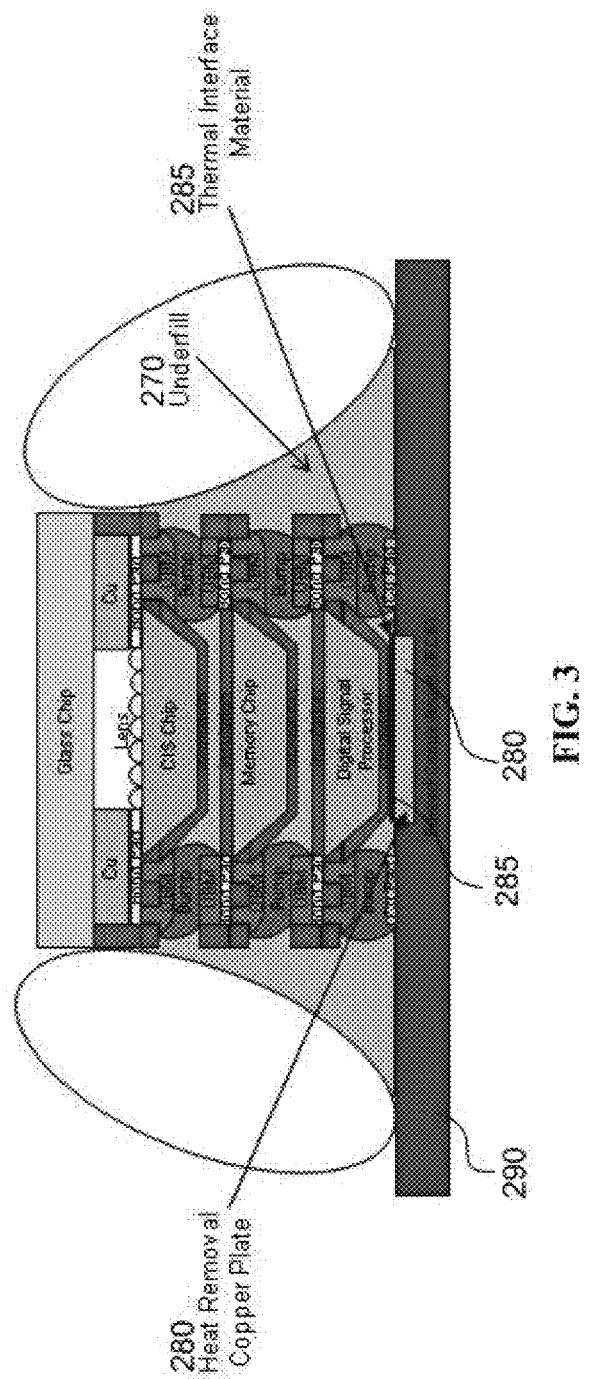
FIG. 3 depicts the application of underfill material and optional heat sink and thermal interface material.

Packaging of a multi-layer device structure is shown in FIG. 3. Underfill material 270 is applied to the multi-layer structure to protect the structure and provide mechanical support. An optional heat sink 280, such as a copper plate, can be embedded in a substrate 290 such as a printed circuit board. Thermal contact between the vertical stack and the heat sink 280 is provided by thermal interface material 285.

Device separation can be performed through any dicing technique along dotted line 250 in FIG. 2M when a single layer device or series of devices is to be the final configuration. Alternatively, the above processes may be repeated for additional wafers (e.g., digital signal processing wafer and memory wafer) and device separation performed following the vertical stack formation.

An alternative electrical interface packaging structure is depicted in FIG. 4. A flexible printed circuit board structure 320 surrounds the multilevel chip structure, optionally including underfill material 270. Copper connections 310 and copper pad 300 interconnect with solder bumps 180 and the flexible printed circuit board 320. Advantageously, this packaging technique can also assist with heat dissipation through the various metallization layers.

In FIG. 5, copper studs 130 are replaced by additional solder bumps 390 and under bump metallizations 370 during fabrication of an array of devices 110.

While the foregoing invention has been described with respect to various embodiments, such embodiments are not limiting. Numerous variations and modifications would be understood by those of ordinary skill in the art. Such variations and modifications are considered to be included within the scope of the following claims.

What is claimed is:

1. A semiconductor device packaged at the wafer level comprising:
    a semiconductor chip including one or more semiconductor devices formed therein;
    a plurality of bonding pads being positioned on the semiconductor chip;
    a protective layer bonded over the semiconductor chip at the plurality of bonding pads or through a plurality of studs positioned over the bonding pads;
    an insulation material positioned on at least side edges and a lower surface of the semiconductor chip;
    interconnection bump metallization positioned adjacent one or more side edges of the semiconductor chip;
    an under bump metallization layer formed between each of the bonding pad pads and the interconnection bump metallization; and
    a patterned insulation material layer covering selected portions of the bonding pads and supporting the under bump metallization layer, wherein the patterned insulation material layer is formed with a same insulation material as that of the insulation material layer and with a same level as that of the insulation material layer, and comprises one or more openings for formation of one or more remaining walls formed with the insulation material at the level, and the openings being to expose portions of the bonding pads to the interconnection bump metallization, and the patterned insulation material layer assisting formation of the under bump metallization layer and providing structural support, and the remaining walls providing mechanical reinforcement of the under bump metallization layer; and
    a separate insulation material formed between the insulation material layer and the protective layer, surrounding the semiconductor chip, and surrounding each of the bonding pads and the studs for isolating each of the bonding pads and the studs, for providing electrical isolation of the semiconductor chip, and for avoiding device contamination by particulates generated during device separation.

2. A semiconductor device according to claim 1 wherein the plurality of bonding pads being one or more electrical bonding pads; and wherein the interconnection bump metallization being electrically connected to at least one of the plurality of electrical bonding pads.

3. A semiconductor device according to claim 1 further comprising plural semiconductor chips integrated horizontally with the semiconductor chip in a horizontal array.

4. A semiconductor device according to claim 1 further comprising additional chips integrated vertically with the semiconductor chip in a vertically-integrated stack.

5. A semiconductor device according to claim 4 wherein at least one chip is an image sensor.

6. A semiconductor device according to claim 5 further comprising a digital signal processing chip integrated vertically with the semiconductor chip and a memory chip integrated vertically with the semiconductor chip.

7. A semiconductor device according to claim 4 further comprising underfill material surrounding the vertically-integrated stack.

8. A semiconductor device according to claim 7 further comprising a substrate including a heat sink thermally connected to the vertically- integrated stack through a thermal interface material, wherein the heat sink is located at the bottom of the vertically-integrated stack.

9. A semiconductor device according to claim 1 wherein the interconnection bump metallization is a solder bump.

10. A semiconductor device according to claim 1 wherein the openings are formed by laser drilling with a laser.

11. A semiconductor device according to claim 1 wherein the studs are metal studs.

12. A semiconductor device according to claim 1 wherein the insulation material layer is a polymer layer, the patterned insulation material layer is a patterned polymer layer, and the insulation material is a polymer.

* * * * *